United States Patent
Endo et al.

(10) Patent No.: US 11,333,564 B2
(45) Date of Patent: May 17, 2022

(54) STRAIN SENSOR FIXING DEVICE FOR A TORQUE SENSOR TO PREVENT SENSOR PERFORMANCE DECREASE

(71) Applicant: NIDEC COPAL ELECTRONICS CORPORATION, Tokyo (JP)

(72) Inventors: Takayuki Endo, Sano (JP); Takashi Kanai, Sano (JP)

(73) Assignee: NIDEC COPAL ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 17/007,756

(22) Filed: Aug. 31, 2020

(65) Prior Publication Data
US 2020/0400515 A1    Dec. 24, 2020

Related U.S. Application Data

(63) Continuation of application No. PCT/JP2019/005422, filed on Feb. 14, 2019.

(30) Foreign Application Priority Data

Apr. 9, 2018   (JP) ............................. JP2018-074792

(51) Int. Cl.
  *G01L 1/22*   (2006.01)
  *G01B 7/16*   (2006.01)
  (Continued)

(52) U.S. Cl.
  CPC ................. *G01L 1/22* (2013.01); *G01B 7/18* (2013.01); *G01L 3/108* (2013.01); *B25J 13/085* (2013.01)

(58) Field of Classification Search
None
See application file for complete search history.

(56) References Cited

U.S. PATENT DOCUMENTS 4,793,189 A * 12/1988 Dell'Orto ................ G01B 7/20
                                            73/775
5,592,021 A    1/1997 Meschter et al.
(Continued)

FOREIGN PATENT DOCUMENTS

CN     1480718    3/2004
CN     102235926  11/2011
(Continued)

OTHER PUBLICATIONS

Office Action issued in counterpart Chinese Application No. 201980016931.1, dated Jun. 3, 2021, with an English translation thereof.
(Continued)

*Primary Examiner* — Lisa M Caputo
*Assistant Examiner* — Nigel H Plumb
(74) *Attorney, Agent, or Firm* — Burris Law, PLLC

(57) ABSTRACT

An embodiment is to provide a strain sensor fixing device and torque sensor using the same capable of preventing the sensor performance from being deteriorated, and preventing the device configuration from being upsized, and further capable of securely fixing the strain sensor to a structure. A fixing member includes a first end and a second end. The first end is provided with a projection which contacts a first structure and the second end contacts a first end of a strain body provided on the first structure. A screw is inserted into the first structure and screwed into a part of the fixing member between the first end and the second end.

6 Claims, 6 Drawing Sheets

(51) Int. Cl.
*G01L 3/10* (2006.01)
*B25J 13/08* (2006.01)

(56) References Cited

U.S. PATENT DOCUMENTS

| | | | | |
|---|---|---|---|---|
| 6,658,942 | B1* | 12/2003 | Faesch | G01L 5/161 |
| | | | | 73/781 |
| 2017/0266814 | A1* | 9/2017 | Uemura | B25J 13/085 |

FOREIGN PATENT DOCUMENTS

| | | |
|---|---|---|
| CN | 202480008 | 10/2012 |
| CN | 202928733 | 5/2013 |
| CN | 103502786 | 1/2014 |
| CN | 105247330 | 1/2016 |
| CN | 205449358 | 8/2016 |
| CN | 206627234 | 11/2017 |
| EP | 2322905 | 5/2011 |
| GB | 966713 | 8/1964 |
| JP | S6267206 | 4/1987 |
| JP | H05248925 | 9/1993 |
| JP | S63032331 | 2/1998 |
| JP | 2009128153 | 6/2009 |
| JP | 2013096735 | 5/2013 |
| JP | 2015049209 | 3/2015 |
| JP | 2017172983 | 9/2017 |
| WO | 2000062340 | 10/2000 |

OTHER PUBLICATIONS

International Search Report for International Application PCT/JP2019/005422, dated May 14, 2019.
Search Report appended to an Office Action, which was issued in counterpart Japanese Application No. 2018074792, by the JPO, dated Oct. 5, 2021, with an English translation thereof.
European Search Report issued in counterpart EP Application No. 19785114.0, dated Dec. 3, 2021.
Office Action issued in corresponding CN Application 201980016931.1, dated Mar. 21, 2022, and an English translation thereof.

* cited by examiner

US 11,333,564 B2

STRAIN SENSOR FIXING DEVICE FOR A TORQUE SENSOR TO PREVENT SENSOR PERFORMANCE DECREASE

CROSS-REFERENCE TO RELATED APPLICATIONS

This application is a continuation of International Application No. PCT/JP2019/005422, filed on Feb. 14, 2019, which claims priority to and the benefit of Japanese Patent Application No. 2018-074792, filed on Apr. 9, 2018. The disclosures of the above applications are incorporated herein by reference.

FIELD

The present disclosure relates to a strain sensor fixing device provided on, for example, an articulation of a robot arm and torque sensor using the fixing device.

BACKGROUND

A torque sensor includes a first structure to which torque is applied, second structure from which torque is output, and a plurality of strain sections serving as beams configured to couple the first structure and second structure to each other, and a plurality of strain gages serving as sensor elements are arranged on these strain sections. A bridge circuit is constituted of these strain gages (refer to, for example, Patent Literature 1 (JP 2013-096735 A), Patent Literature 2 (JP 2015-049209 A), and Patent Literature 3 (JP 2017-172983 A)).

SUMMARY

In general, a strain sensor is provided with, on a metallic strain body, a plurality of strain gages serving as sensor elements. As a method of fixing the strain sensor to a torque sensor, there are, for example, a method adopting welding, method using an adhesive, and method of using a plurality of screws.

However, when a strain sensor is fixed to a structure by welding, the temperature of the strain body rises rapidly due to the welding. Accordingly, there is a possibility of the composition and shape of the strain body and strain gage being changed, and performance of the strain sensor being adversely affected.

Further, when the strain sensor is fixed to the structure by using an adhesive, the low-stiffness adhesive is interposed between the strain body and structure. Accordingly, deformation of the structure is not directly transmitted to the strain body, and there is a possibility of the sensitivity of the strain sensor being deteriorated.

On the other hand, when the strain sensor is fixed to the structure by using screws, by providing a pressing member on the strain body, and by fastening the pressing member to the structure by means of screws, the strain body is fixed to the structure by the pressing member. In the case of such a configuration, the pressing member and strain body are brought into surface contact with each other, and hence the pressing member needs to maintain high suppress strength with respect to the strain body. In order to maintain high suppress strength, upsizing and high stiffness enhancement of the pressing member, upsizing of screws, and increasing of the number of screws are required. Accordingly, it becomes difficult to realize downsizing and thinning of a torque sensor provided with a pressing member and screws.

An embodiment described herein aims to provide a strain sensor fixing device and torque sensor using the same capable of preventing the sensor performance from being deteriorated, and preventing the device configuration from being upsized, and further capable of securely fixing the strain sensor to a structure.

According to an embodiment, there is provided a strain sensor fixing device comprising a fixing member including a first end and a second end, and the second end being come into contact with a third end of a strain body provided on a first structure; a projection provided at one of the first end of the fixing member and a part of the first structure corresponding to the first end; and a screw to be inserted into the first structure and screwed into a part of the fixing member between the first end and the second end.

According to an embodiment, there is provided a torque sensor comprising: a first structure; a second structure; a plurality of third structures connecting the first structure and the second structure to each other; a strain body provided between the first structure and the second structure; a first fixing device provided on the first structure and configured to fix a first end of the strain body to the first structure; and a second fixing device provided on the second structure and configured to fix a second end of the strain body to the second structure, wherein each of the first fixing device and the second fixing device includes a fixing member including a third end and a fourth end, the fourth end coming into contact with the first end of the strain body provided on the first structure or the second end of the strain body provided on the second structure, a projection provided at one of the third end of the fixing member and a part of the first structure corresponding to the third end, or a projection provided at one of the third end of the fixing member and a part of the second structure corresponding to the third end, and a screw to be inserted into the first structure or the second structure and screwed into a part of the fixing member between the third end and the fourth end of the fixing member.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

DRAWINGS

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION

Figure 1:
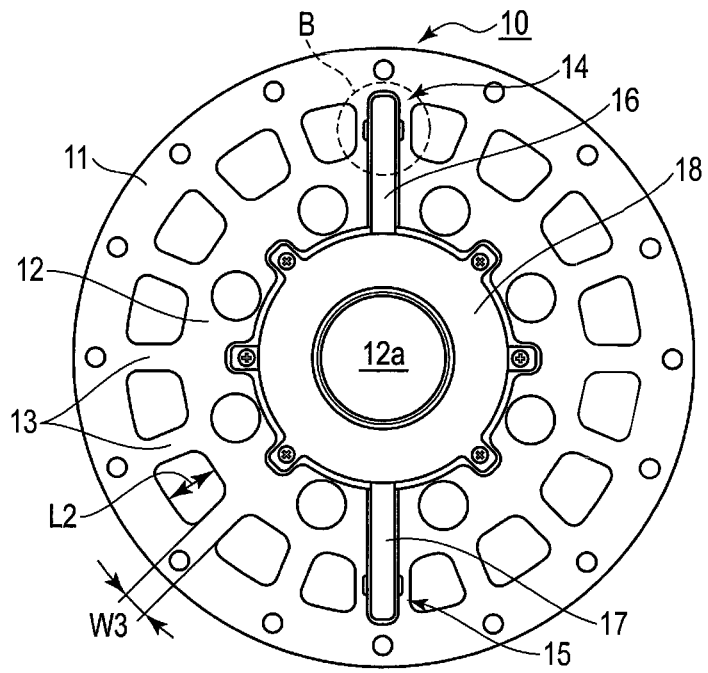
FIG. 1 is a plan view showing a torque sensor to which this embodiment is applied.

Hereinafter, an embodiment of the present invention will be described below with reference to the accompanying drawings. In the drawings, the same parts are denoted by the same reference symbols.

FIG. 1 shows an example of a torque sensor 10 to which this embodiment is applied. The configuration of the torque sensor is not limited to this, and this embodiment can be applied to torque sensors of various configurations. Further, this embodiment can be applied not only to torque sensors but also to a force sensor or the like using strain gages.

In FIG. 1, the torque sensor 10 comprises a first structure 11, second structure 12, plurality of third structures 13, fourth structure 14, fifth structure 15, stoppers 16 and 17, and cover 18.

The first structure 11 and second structure 12 are each formed annular and the diameter of the second structure 12 is less than the diameter of the first structure 11. The second structure 12 is arranged concentric with the first structure 11, and first structure 11 and second structure 12 are coupled to each other by the third structures 13 serving as a plurality of radially arranged beam sections. The second structure 12 includes a hollow section 12a and, for example, wiring not shown is passed through the hollow section 12a.

The first structure 11 is coupled to, for example, an object to be measured, and the plurality of third structures 13 transmit torque from the first structure 11 to the second structure 12. Conversely, the second structure 12 may be coupled to the object to be measured, and torque may also be transmitted from the second structure 12 to the first structure 11 through the plurality of third structures 13.

Although the first structure 11, second structure 12, and plurality of third structures 13 are constituted of metal, for example, stainless steel, materials other than metal can also be used if sufficient mechanical strength can be obtained with respect to the torque to be applied.

Figure 2:
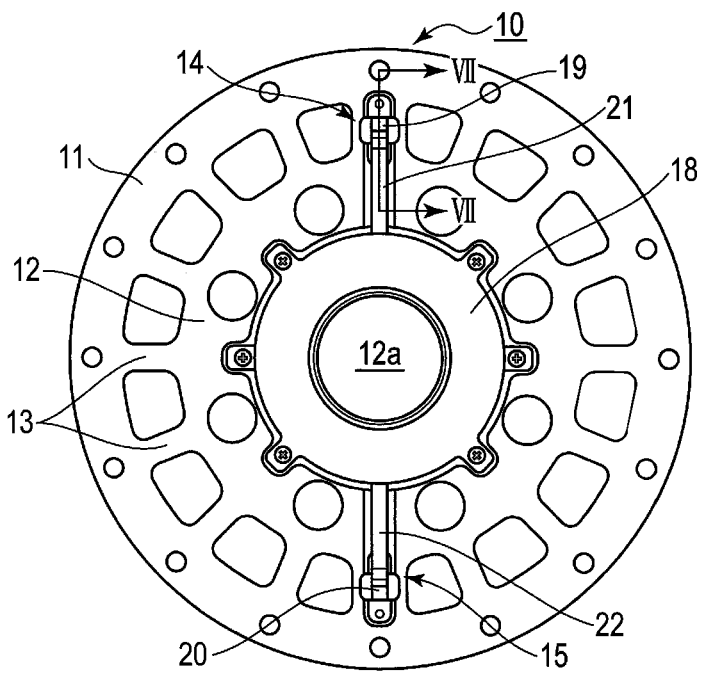
FIG. 2 is a plan view showing FIG. 1 part of which is removed.

FIG. 2 shows the state where the stoppers 16 and 17 of FIG. 1 are removed. Between the first structure 11 and second structure 12, a first strain sensor 19 and second strain sensor 20 are provided. That is, as will be described later, one end of each of the first strain sensor 19 and second strain sensor 20 is joined to the first structure 11, and the other end of each of the first strain sensor 19 and second strain sensor 20 is joined to the second structure 12.

Further, the first strain sensor 19 and second strain sensor 20 are arranged at positions symmetrical with respect to the center (center of action of torque) of each of the first structure 11 and second structure 12. In other words, the first strain sensor 19 and second strain sensor 20 are arranged on the diameters of the annular first structure 11 and second structure 12.

A thickness of each of the first strain sensor 19 and second strain sensor 20, i.e., thickness of a strain body to be described later is less than the thickness of the third structure 13. The mechanical strength of the torque sensor 10 is set according to the thickness and width of the third structure 13. The strain body is provided with a plurality of strain gages functioning as sensor elements, and a bridge circuit is constituted of these sensor elements.

Each of the stoppers 16 and 17 has a function of protecting each of the first strain sensor 19 and second strain sensor 20 from mechanical deformation, and serving as a cover of each of the first strain sensor 19 and second strain sensor 20 configured to prevent moisture from intruding into each of the first strain sensor 19 and second strain sensor 20. Details of the stoppers 16 and 17 will be described later.

The first strain sensor 19 is connected to a flexible board 21 and second strain sensor 20 is connected to a flexible board 22. The flexible boards 21 and 22 are connected to a printed board (not shown) covered with a cover 18. On the printed board, an operational amplifier and the like configured to amplify an output voltage of the bridge circuit to be described later are arranged. The circuit configuration is not the nature of this embodiment, and a description thereof is omitted.

Figure 3:
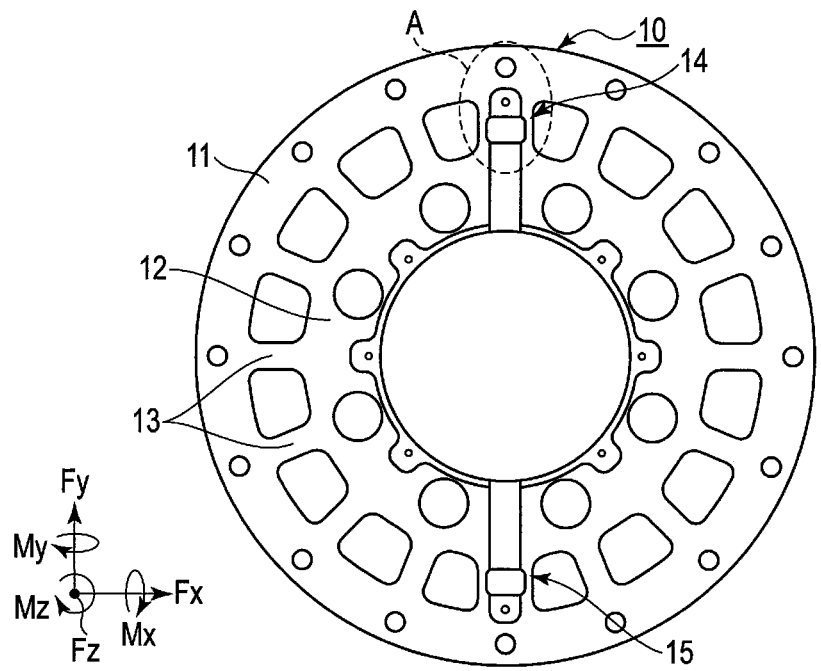
FIG. 3 is a plan view showing FIG. 2 part of which is removed.
Figure 4:
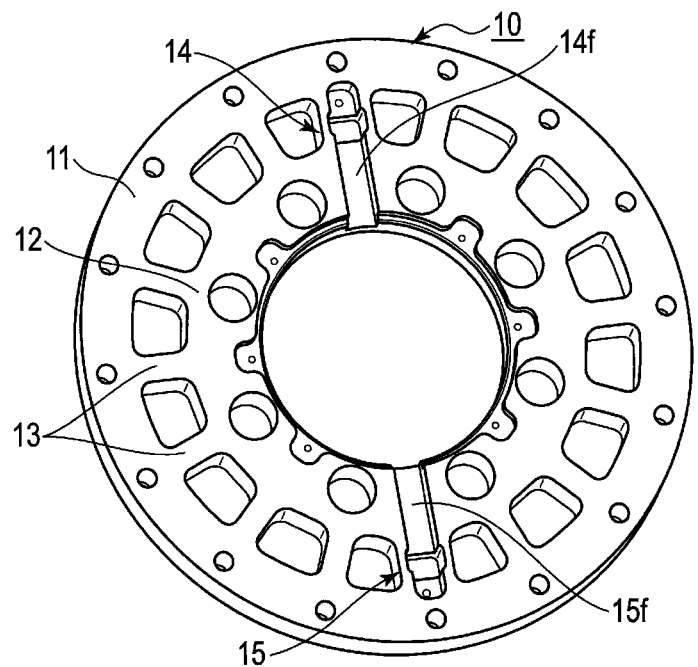
FIG. 4 is a perspective view of FIG. 3.

FIG. 3 and FIG. 4 each show, by removing the first strain sensor 19, second strain sensor 20, flexible boards 21 and 22, cover 18 and the like from FIG. 1 and FIG. 2, only the first structure 11, second structure 12, plurality of third structures 13, fourth structure 14, and fifth structure 15.

The torque sensor 10 is configured to have such a structure that, when force in the direction other than the torque (Mz) direction, particularly, in the Fz direction or Mx direction indicated by the arrow shown in FIG. 3 is applied thereto, strain is not concentrated at the plurality of strain gages serving as sensor elements provided on the strain bodies of the first strain sensor 19 and second strain sensor 20.

More specifically, the fourth structure 14 and fifth structure 15 are provided at positions symmetrical with respect to the center of each of the first structure 11 and second structure 12, fourth structure 14 includes a concave section 14f continuous from the first structure 11 to the second structure 12, and fifth structure 15 includes a concave section 15f continuous from the first structure 11 to the second structure 12. As will be described later, the first strain sensor 19 is arranged inside the concave section 14f of the fourth structure 14, and second strain sensor 20 is arranged inside the concave section 15f of the fifth structure 15.

It should be noted that although FIGS. 1 to 4 are shown about the case where two strain sensors including the first strain sensor 19 and second strain sensor 20 are provided, the number of strain sensors may be three or more. In this case, it is sufficient if the number of structures is increased according to the number of strain sensors.

Since the fourth structure 14 and fifth structure 15 are of the same configuration, only the fourth structure 14 will be described in detail.

Figure 5:
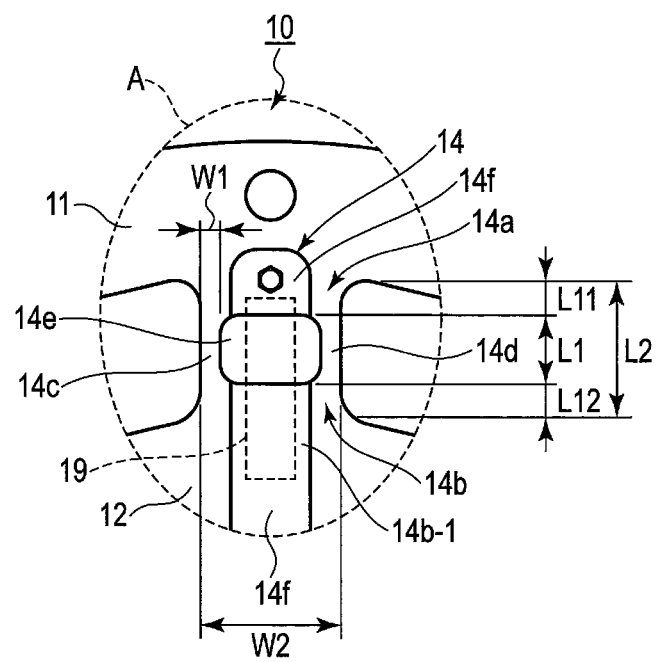
FIG. 5 is a plan view showing the enlarged part A shown in FIG. 3 and indicated by a broken line.

As shown in FIG. 5, the fourth structure 14 includes a first connection section 14a and second connection section 14b serving as a joint section configured to join the first strain sensor 19, third connection section 14c and fourth connection section 14d serving as a beam, and opening section 14e surrounded by the first connection section 14a, second connection section 14b, third connection section 14c, and fourth connection section 14d.

In other words, the fourth structure 14 is a beam including the opening section 14e provided between the first structure 11 and second structure 12.

The first connection section 14a extends from the first structure 11 to the second structure 12 side. The second connection section 14b extends from the second structure 12 to the first structure 11 side.

The third connection section 14c and fourth connection section 14d serving as the beam are provided between the first connection section 14a and second connection section 14b.

The length L1 of each of the third connection section 14c and fourth connection section 14d is shorter than the length L2 (shown also in FIG. 1) of the third structure 13 serving as the beam. The width W1 of each of the third connection section 14c and fourth connection 14d in the torque (Mz) direction is narrower than the width W2 of each of the first connection section 14a and second connection section 14b in the torque direction, and total of the widths W1 of the third connection section 14c and fourth connection section 14d is narrower than the width W3 (shown in FIG. 1) of the third structure 13 in the torque (Mz) direction. For this reason, the stiffness of the third connection section 14c and fourth connection section 14d in the torque direction is lower than the stiffness of each of the first connection section 14a, second connection section 14b, and third structure 13 in the torque direction.

Further, the thickness of each of the third connection section 14c and fourth connection section 14d in the Fz direction is equal to the thickness of each of the first structure, second structure, and third structure in the Fz direction. Furthermore, the total of the length L11 of the first connection section 14a, length L12 of the second connection section 14b, and length L1 of the third connection section 14c or fourth connection section 14d is equal to the length of the third structure 13. Accordingly, the stiffness of the third connection section 14c and fourth connection section 14d in the Fz direction becomes somewhat less than the stiffness of the third structure 13 in the Fz direction.

It should be noted that the total of the length L11 of the first connection section 14a, length L12 of the second connection 14b, and length L1 of the third connection section 14c or fourth connection section 14d is not limited to the case where the total is equal to the length of the third structure 13, and may not be equal to the length of the third structure 13.

It should be noted that in this embodiment, the configurations of the fourth structure 14 and fifth structure 15 are not limited to these, and it is sufficient if the configurations are those respectively capable of holding the first strain sensor 19 and second strain sensor 20.

Figure 6:
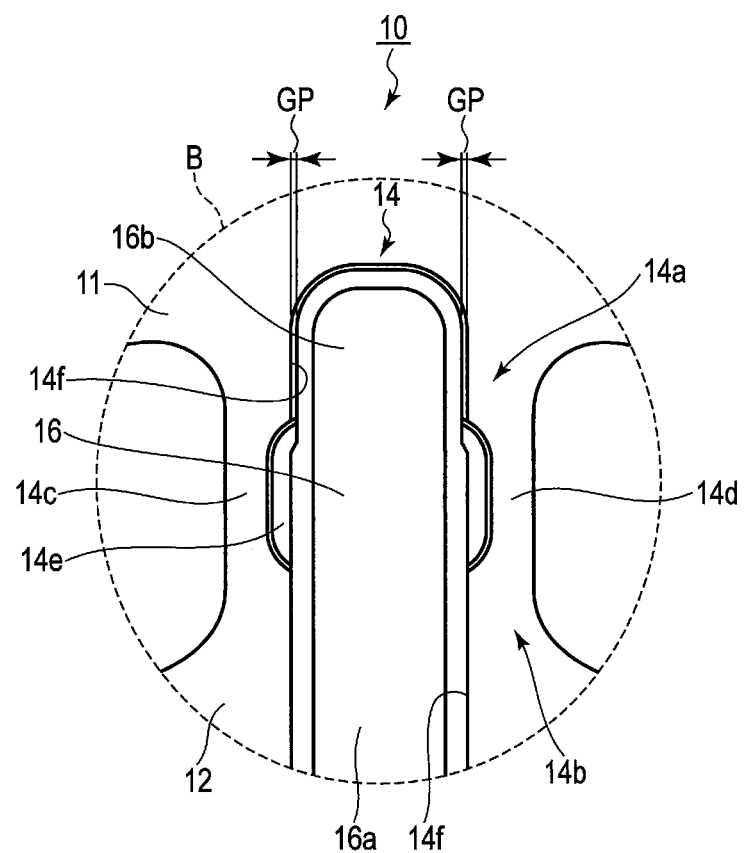
FIG. 6 is a plan view showing the enlarged part B of FIG. 1.

FIG. 6 shows the part of FIG. 1 indicated by B in FIG. 1 in an enlarging manner.

As described previously with reference to FIG. 2, the first strain sensor 19 is covered with the stopper 16 and second strain sensor 20 is covered with the stopper 17. The stopper 16 and stopper 17 are formed of, for example, stainless steel or ferrous alloy. The stopper 16 and stopper 17 prevent mechanical deformation of the first strain sensor 19 and second strain sensor 20 from occurring, and protect a plurality of strain gages 19-2 (shown in FIG. 8). Furthermore, the stopper 16 and stopper 17 each double as waterproof covers of the first strain sensor 19 and second strain sensor 20. A description of the specific waterproof structure is omitted.

The stopper 16 and stopper 17 are identical in configuration, and hence only the stopper 16 will be described below.

As shown in FIG. 6, the stopper 16 includes a one end 16a and the other end 16b, and a width of the other end 16b of the stopper 16 is made narrower than the width of the one end 16a. The one end 16a of the stopper 16 is, for example, press-fitted into the concave section 14f serving as an engaging section formed on the second structure 12 side of the fourth structure 14, and is fixed therein. The other end 16b of the stopper 16 is arranged inside the concave section 14f formed on the first structure 11 side of the fourth structure 14. The width of the other end 16b of the stopper 16 is narrower than the width of the concave section 14f on the first structure 11 side, and between the both sides of the other end 16b of the stopper 16 and side faces of the concave section 14f, gaps GP are provided.

The gap GP is determined according to the stiffness of the third structure 13 and rated torque. More specifically, in the case where torque of, for example, 1000 N·m is applied to the torque sensor 10, and the first structure 11 is deformed by, for example, 10 μm relatively to the second structure 12, the gap GP is set to, for example, 10 μm.

(Configuration of Fixing Device)

Figure 7:
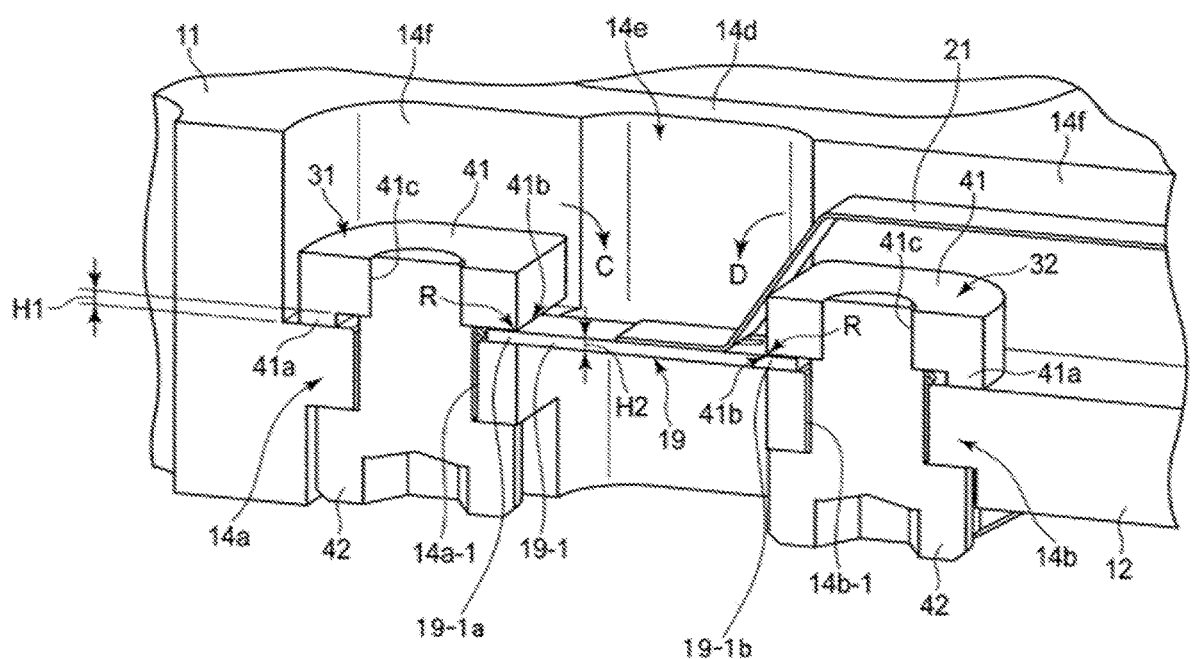
FIG. 7 is a view showing this embodiment and is a cross-sectional view along line VII-VII of FIG. 2.
Figure 8:
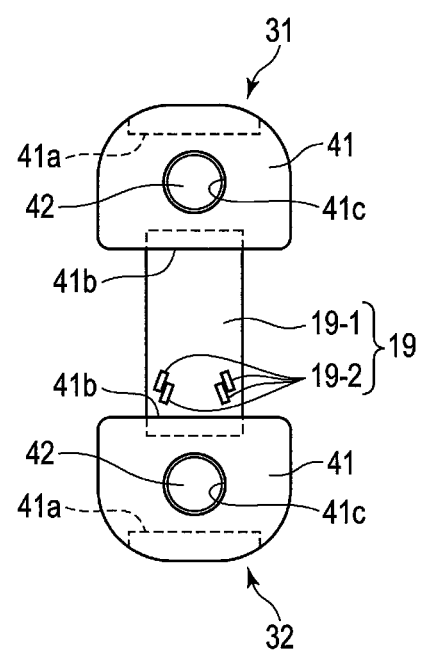
FIG. 8 is a plan view showing a relationship between the fixing member and strain body shown in FIG. 7.

FIG. 7 and FIG. 8 each show strain sensor fixing devices 31 and 32 according to this embodiment. The fixing device 31 fixes a first end of a strain body 19-1 constituting the first strain sensor 19 to the first connection section 14a, and fixing device 32 fixes a second end of the strain body 19-1 to the second connection section 14b.

The fixing devices 31 and 32 are identical in configuration, and hence the configuration will be described below in connection with the fixing device 31 and, in the fixing device 32, parts identical to the fixing device 31 are denoted by reference symbols identical to the fixing device 31.

The fixing device 31 comprises a fixing member 41, and screw 42. A width of the fixing member 41 is made slightly narrower than the width of the concave section 14f and, in a state where the fixing member 41 is provided inside the concave section 14f, side faces of the fixing member 41 are enabled to be in contact with side faces of the concave section 14f. Accordingly, when the fixing member 41 is fastened by the screw to be described later, the fixing member 41 is prevented from being turned inside the concave section 14f.

The fixing member includes a projection 41a at a first end thereof, includes an angulated section 41b at a second end thereof, and includes a threaded hole 41c between the first end and second end.

The projection 41a is in contact with the bottom of the concave section 14f. The height H1 of the projection 41a is higher than the thickness H2 of the strain body 19-1. That is, a relationship (H1>H2) is established. It is desirable that the angulated section 41b be in line contact with the strain body 19-1. Accordingly, as the machining accuracy of the angulated section 41b, it is desirable that the radius R be equal to or less than 0.1 mm.

As shown in FIG. 8, the width of the fixing member 41 is wider than the width of the strain body 19-1, and angulated section 41b of the fixing member 41 is made possible to be in contact with the whole first end or whole second end of the strain body 19-1 in the width direction.

As shown in FIG. 7, the first connection section 14a is included in the first structure 11, and first connection section 14a constitutes the bottom of the concave section 14f. In the bottom of the concave section 14f, a through hole 14a-1 into which the screw 42 is inserted is provided. The second connection section 14b is included in the second structure 12, and second connection section 14b constitutes the bottom of the concave section 14f. In the bottom of the concave section 14f, a through hole 14b-1 into which the screw 42 is inserted is provided. The screws 42 are screwed into the threaded holes 41c of the fixing members 41 in a state where the screws 42 are respectively inserted into the through holes 14a-1 and 14b-1.

In the configuration described above, when the first strain sensor 19 is to be fixed by the fixing device 31 and fixing device 32, the first strain sensor 19 is arranged between the first connection section 14a and second connection section 14b as shown in FIG. 7. In this state, the angulated section 41b of the fixing member 41 of the fixing device 31 is brought into contact with the first end 19-1a of the strain body 19-1 constituting the strain sensor 19, and angulated section 41b of the fixing member 41 of the fixing device 32 is brought into contact with the second end 19-1b of the strain body 19-1 constituting the first strain sensor 19.

In this state, when the screw 42 is tightened, the fixing member 41 is rotated in the direction C or D indicated by an arrow in FIG. 7 around the projection 41a serving as a fulcrum, and the angulated section 41b of the fixing member 41 is brought into pressure contact with the surface of the strain body 19-1. Thereby, the angulated section 41b of the fixing member 41 is brought into line contact with the surface of the strain body 19-1, and the strain body 19-1 is fixed to the first connection section 14a and second connection section 14b by means of the two fixing members 41.

Advantage of Embodiment

According to the embodiment described above, by tightening the screw 42, the fixing member 41 is rotated around the projection 41a serving as a fulcrum, and angulated section 41b comes into line contact with the strain body 19-1. Accordingly, it is possible to fix the strain body 19-1 to the first structure 11 and second structure 12 with high pressure as compared with the conventional case where the strain body and fixing member are brought into surface contact with each other. Accordingly, it is possible to reduce the variation in strength of fixing of the strain body 19-1 to the first structure 11 and second structure 12.

Moreover, according to the fixing method using the fixing member 41 of this embodiment, by only bringing the angulated section 41b of the fixing member 41 into line contact with the strain body 19-1, it is possible to fix the strain body 19-1 to the first structure 11 and second structure 12. Accordingly, unlike in the case where the strain body 19-1 is fixed to the first structure 11 and second structure 12 by welding, it is possible to prevent thermal deformation of the strain body 19-1 and strain gage from occurring. Further, unlike in the case where the strain body 19-1 is fixed with an adhesive, no low-stiffness section is interposed between the strain body 19-1 and first structure 11 or second structure 12. Therefore, according to the fixing method using the fixing member 41 of this embodiment, it is possible to prevent the sensitivity of the torque sensor 10 from being deteriorated.

Furthermore, in, for example, the case where the strain body is fixed to the structure by using a fixing member and plurality of screws, by providing a fixing member having a width greater than the strain body on the strain body, and screwing the plurality of screws provided on both sides of the fixing member in the width direction into the structure, the strain body is fixed with the fixing member. In this case, by tightening the plurality of screws, the fixing member is deformed, and the central part of the fixing member in the width direction is separated from the surface of the strain body. Accordingly, the effective contact area between the strain body and fixing member is reduced, and fixing strength is lowered. Accordingly, in order to suppress deformation of the pressing member and obtain necessary fixing strength, the thickness of the pressing member needs to be increased.

Conversely, in the case of this embodiment, the fixing member 41 is rotated by one screw 42 provided between the projection 41a and angulated section 41b toward the first structure 11 side or second structure side, and angulated section 41 of the fixing member 41 is brought into line contact with the strain body 19-1. Accordingly, the angulated section 41b of the fixing member 41 is hardly deformed in the direction perpendicular to the width direction of the strain body 19-1. Therefore, the angulated section 41b of the fixing member 41 can come into line contact with the strain body 19-1 without interruption in the width direction. Accordingly, there is no need to increase the thickness of the fixing member 41 more than necessary in order to obtain the necessary fixing strength, and it is possible to prevent the fixing member 41 from being upsized.

Moreover, each of the fixing devices 31 and 32 is constituted of one fixing member 41 and one screw 42. Accordingly, it is possible with less number of parts to prevent the fixing devices 31 and 32 from being upsized, and prevent the torque sensor 10 from being upsized.

Furthermore, each of the fixing devices 31 and 32 is constituted of one fixing member 41 and one screw 42, and hence assembly of the fixing devices 31 and 32 is facilitated.

It should be noted that although the fixing member 41 includes the projection 41a, the projection 41a is not necessarily provided on the fixing member 41 and, may also be provided on, for example, the first structure 11 or second structure 12. More specifically, each of the projections 41a may be provided at each of parts on the surface of the first connection section 14a and second connection section 14b and corresponding to the first end of the fixing member, and the first end of the fixing member 41 may be placed on the projection 41a. That is, it is sufficient if the fixing member 41 is provided in such a manner as to be rotatable around the projection 41a serving as a fulcrum.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A strain sensor fixing device comprising:
    a fixing member including a first end and a second end, the second end coming into contact with an end of a strain body provided on a first structure;
    a projection provided at one of the first end of the fixing member and a part of the first structure corresponding to the first end; and
    a screw to be inserted into the first structure and screwed into a part of the fixing member between the first end and the second end.

2. The strain sensor fixing device of claim 1, wherein a height of the projection is higher than a thickness of the strain body.

3. The strain sensor fixing device of claim 2, wherein the second end of the fixing member is wider than a width of the strain body and comes into line contact with the strain body.

4. A torque sensor comprising:
    a first structure;
    a second structure;
    a plurality of third structures connecting the first structure and the second structure to each other;
    a strain body provided between the first structure and the second structure;
    a first fixing device provided on the first structure and configured to fix a first end of the strain body to the first structure; and
    a second fixing device provided on the second structure and configured to fix a second end of the strain body to the second structure, wherein each of the first fixing device and the second fixing device includes a fixing member including a third end and a fourth end, the fourth end coming into contact with the first end of the strain body provided on the first structure or the second end of the strain body provided on the second structure, a projection provided at one of the third end of the fixing member and a part of the first structure corresponding to the third end, or a projection provided at one of the third end of the fixing member and a part of the second structure corresponding to the third end, and a screw to be inserted into the first structure or the second structure and screwed into a part of the fixing member between the third end and the fourth end of the fixing member.

5. The torque sensor of claim 4, wherein
a height of the projection is higher than a thickness of the strain body.

6. The torque sensor of claim 5, wherein
the fourth end of the fixing member is wider than a width of the strain body and comes into line contact with the strain body.

\* \* \* \* \*